(12) United States Patent
Chang et al.

(10) Patent No.: US 7,393,159 B2
(45) Date of Patent: Jul. 1, 2008

(54) INLINE TRANSFER SYSTEM AND METHOD

(75) Inventors: Won-Kie Chang, Seoul (KR); Gi-Cheon Yoon, Sungnam (KR); Geun-Soo An, Cheonan (KR)

(73) Assignee: Samsung Electronics Co., Ltd., Suwon (KR)

( * ) Notice: Subject to any disclaimer, the term of this patent is extended or adjusted under 35 U.S.C. 154(b) by 174 days.

(21) Appl. No.: 10/863,064

(22) Filed: Jun. 7, 2004

(65) Prior Publication Data

US 2005/0063791 A1    Mar. 24, 2005

(30) Foreign Application Priority Data

Sep. 5, 2003    (KR)    ...................... 10-2003-0062205

(51) Int. Cl.
*B65G 51/00*    (2006.01)
(52) U.S. Cl. .......................................... 406/88; 414/676
(58) Field of Classification Search .................. 406/88; 414/676, 222.09; 198/347.1, 347.4
See application file for complete search history.

(56) References Cited

U.S. PATENT DOCUMENTS

| | | | | |
|---|---|---|---|---|
| 3,399,042 A * | 8/1968 | McMaster et al. | ............. | 65/25.4 |
| 3,580,640 A * | 5/1971 | Eriksson | ........................ | 406/19 |
| 3,812,947 A * | 5/1974 | Nygaard | ...................... | 198/617 |
| 3,865,254 A * | 2/1975 | Johannsmeier | ............... | 414/676 |
| 3,976,330 A * | 8/1976 | Babinski et al. | ................ | 406/84 |
| 4,009,785 A * | 3/1977 | Trayes | ......................... | 414/676 |
| 4,014,428 A * | 3/1977 | Ossbahr | ..................... | 198/345.3 |
| 4,293,249 A * | 10/1981 | Whelan | ......................... | 406/72 |
| 4,348,139 A * | 9/1982 | Hassan et al. | .................. | 406/10 |
| 4,378,182 A * | 3/1983 | Futer | ............................. | 406/10 |
| 4,612,946 A * | 9/1986 | Noh et al. | ...................... | 134/62 |
| 4,772,176 A * | 9/1988 | Montgomery | ............... | 414/800 |
| 5,248,236 A * | 9/1993 | Ooshima et al. | ............. | 414/676 |
| 5,354,168 A * | 10/1994 | Allison et al. | ............... | 414/676 |
| 5,417,524 A * | 5/1995 | Newton | ........................ | 406/88 |
| 5,921,744 A * | 7/1999 | Toda et al. | .................... | 414/755 |
| 6,336,775 B1 * | 1/2002 | Morita et al. | .................. | 406/88 |
| 6,354,789 B2 * | 3/2002 | Takeuchi et al. | ............. | 414/676 |
| 6,630,633 B1 * | 10/2003 | Uber et al. | .................... | 177/145 |
| 6,692,196 B1 * | 2/2004 | Simm et al. | ................... | 406/88 |
| 6,736,588 B1 * | 5/2004 | Baldwin et al. | ............. | 414/676 |
| 7,108,474 B2 * | 9/2006 | Moriya et al. | ............... | 414/676 |
| 7,134,222 B2 * | 11/2006 | An et al. | ........................ | 34/576 |
| 7,140,827 B2 * | 11/2006 | Ikehata et al. | ............... | 414/676 |
| 7,165,918 B2 * | 1/2007 | Kruse | ........................... | 406/93 |

* cited by examiner

*Primary Examiner*—Douglas A Hess
(74) *Attorney, Agent, or Firm*—Mark A. Pellegrini; MacPherson Kwok Chen & Heid, LLP.

(57) ABSTRACT

An inline transfer system and method are provided for the secure transport and efficient processing of substrates such as glass substrates or semiconductor devices. A rotary conveyor is provided that includes a plurality of air nozzles which inject air to move a substrate above the plurality of air nozzles without the plurality of air nozzles making contact with the substrate. At least two independent processing units are operably coupled to the rotary conveyor. Advantageously, because a plurality of substrates may be processed in parallel, greater efficiency and flexibility are provided. Because the substrate can be moved without physical contact between the structure of the air nozzles and the substrate, the transfer is secure, clean, and efficient.

3 Claims, 14 Drawing Sheets

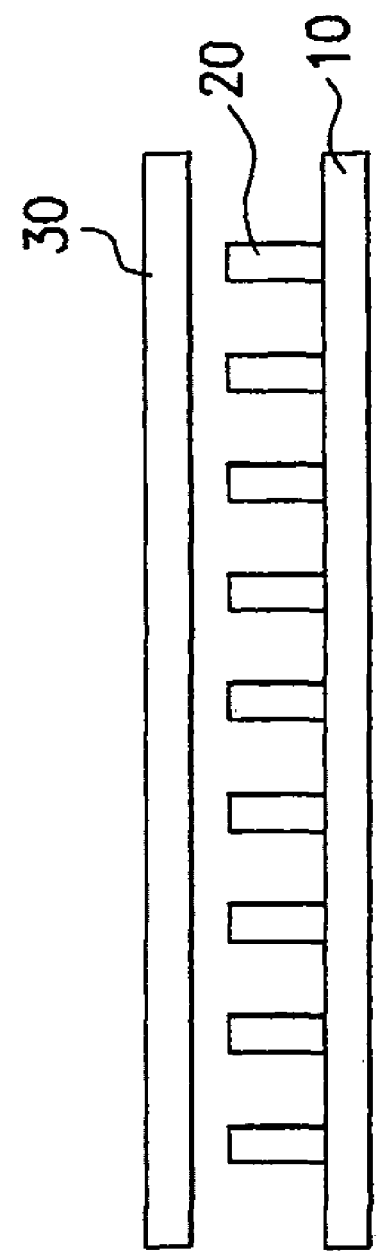

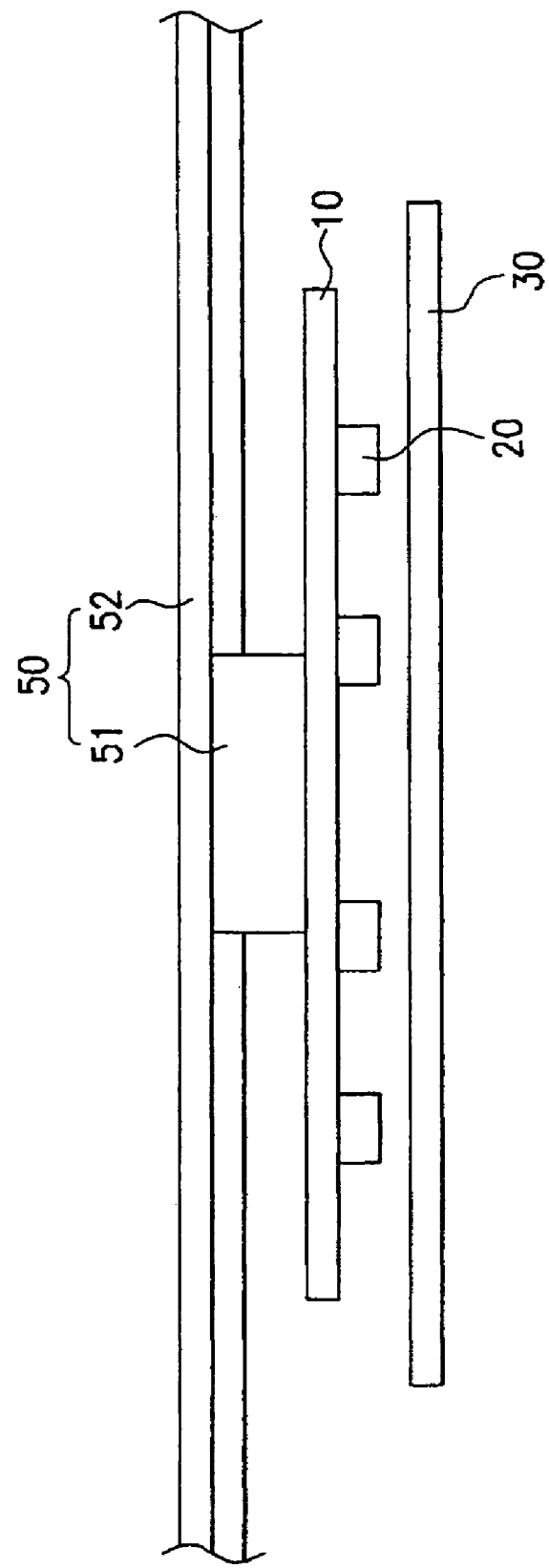

INLINE TRANSFER SYSTEM AND METHOD

BACKGROUND (a) Field of the Invention

The present invention relates to an inline transfer system and method, and more particularly to an inline transfer system and method for processing glass substrates.

(b) Description of Related Art

In general, a transfer system operates to move a transfer body by placing the transfer body onto a conveyor and sliding the conveyor using an operating roller connected to an operating motor. The conventional conveyor system uses a motor for power to move a body and a chain, a gear, or a belt for the purpose of power transfer.

The transfer system can be utilized to transfer glass substrates in manufacturing liquid crystal displays ("LCDs") in one example. An LCD is one of the most popular flat panel displays, which includes two panels provided with two kinds of electrodes generating an electric field and a liquid crystal layer interposed therebetween. The LCD displays images by controlling light transmittance, and the control of the light transmittance is performed by applying voltages to the electrodes to generate electric fields which change the arrangement of liquid crystal molecules.

The two panels of an LCD are transferred to the processing device of each manufacturing process using the transfer system to complete an LCD.

Conventionally, a plurality of glass substrates is transferred to the processing device of each manufacturing process using a cassette, a stocker, and an indexer. In other words, the transfer system for a LCD manufacturing process receives a plurality of glass substrates to the cassette, stores them in the stocker, and carries them in and out to the processing device of each manufacturing process using a robot indexer.

However, as glass substrates are increasing in size, a transfer system using the cassette, stocker, and indexer becomes more difficult to use because a typical cassette, stocker, or indexer transfers a plurality of glass substrates, and thus an existing cassette, stocker, or indexer must be made larger to transfer substrates of a larger size. Furthermore, several disadvantages occur in a typical transfer system with larger glass substrates, such as inefficiency, lower yield due to breaks and contamination, and lack of flexibility. Thus, there is a need in the art for an efficient and flexible system and method for processing substrates.

SUMMARY

The present invention provides an advantageous system and method for transferring and processing fragile objects, such as glass substrates used in the manufacture of LCDs, in which cleanliness and secure transport are of high concern. A rotary conveyor utilizes a plurality of air nozzles to transport substrates without making direct contact between the air nozzle structure and the substrate, thereby allowing for clean and secure transport of the substrate. Coupled to the rotary conveyor are at least two independent processing units or at least two independent inspection devices.

According to one embodiment of the present invention, an inline transfer system is provided, including a rotary conveyor including a panel, and a plurality of air nozzles operably coupled to the panel, wherein the plurality of air nozzles inject air to move a substrate above the plurality of air nozzles without the plurality of air nozzles making contact with the substrate. At least two processing units are operably coupled to the rotary conveyor, wherein the at least two processing units operate independently of each other providing operating flexibility and efficiency.

According to another embodiment of the present invention, another inline transfer system is provided, including a rotary conveyor and at least two inspection devices operably coupled to the rotary conveyor, wherein the at least two inspection devices operate independently of each other. A substrate classifier for classifying the inspected substrates is operably coupled to the rotary conveyor.

According to yet another embodiment of the present invention, an inline transfer method is provided, including providing a first rotary conveyor operably coupled to a first set of processing units and a second set of processing units, and providing a second rotary conveyor operably coupled to the first set of processing units and the second set of processing units. The second rotary conveyor is operably coupled to the first rotary conveyor by at least one elevator. The method further includes providing a substrate on the first rotary conveyor for processing in one of the first set of processing units and one of the second set of processing units. A determination is made whether the substrate is allowed to be processed in one of the first set of processing units, and the substrate is processed in one of the first set of processing units when allowed. The substrate is transferred to one of the second set of processing units via the first rotary conveyor or the second rotary conveyor. A determination is made as to whether the substrate is allowed to be subsequently processed in one of the second set of processing units, and the substrate is processed in one of the second set of processing units when allowed.

Advantageously, the present invention allows for the secure and clean transport and processing of glass substrates and other fragile objects, resulting in higher yields with less damage and contamination. The present invention is also advantageous for providing flexibility and efficiency such that processing may occur in parallel and not be delayed when one line has a malfunction.

These and other features and advantages of the present invention will be more readily apparent from the detailed description of the embodiments set forth below taken in conjunction with the accompanying drawings.

BRIEF DESCRIPTION OF THE DRAWINGS

FIG. 2A is a sectional view of the transfer apparatus shown in FIG. 1A taken along the line II-II';

FIG. 12A is a lateral view of the transfer apparatus shown in FIG. 11A; and

Use of the same reference symbols in different figures indicates similar or identical items. It is further noted that the drawings may not be drawn to scale.

DETAILED DESCRIPTION

Figure 1A:
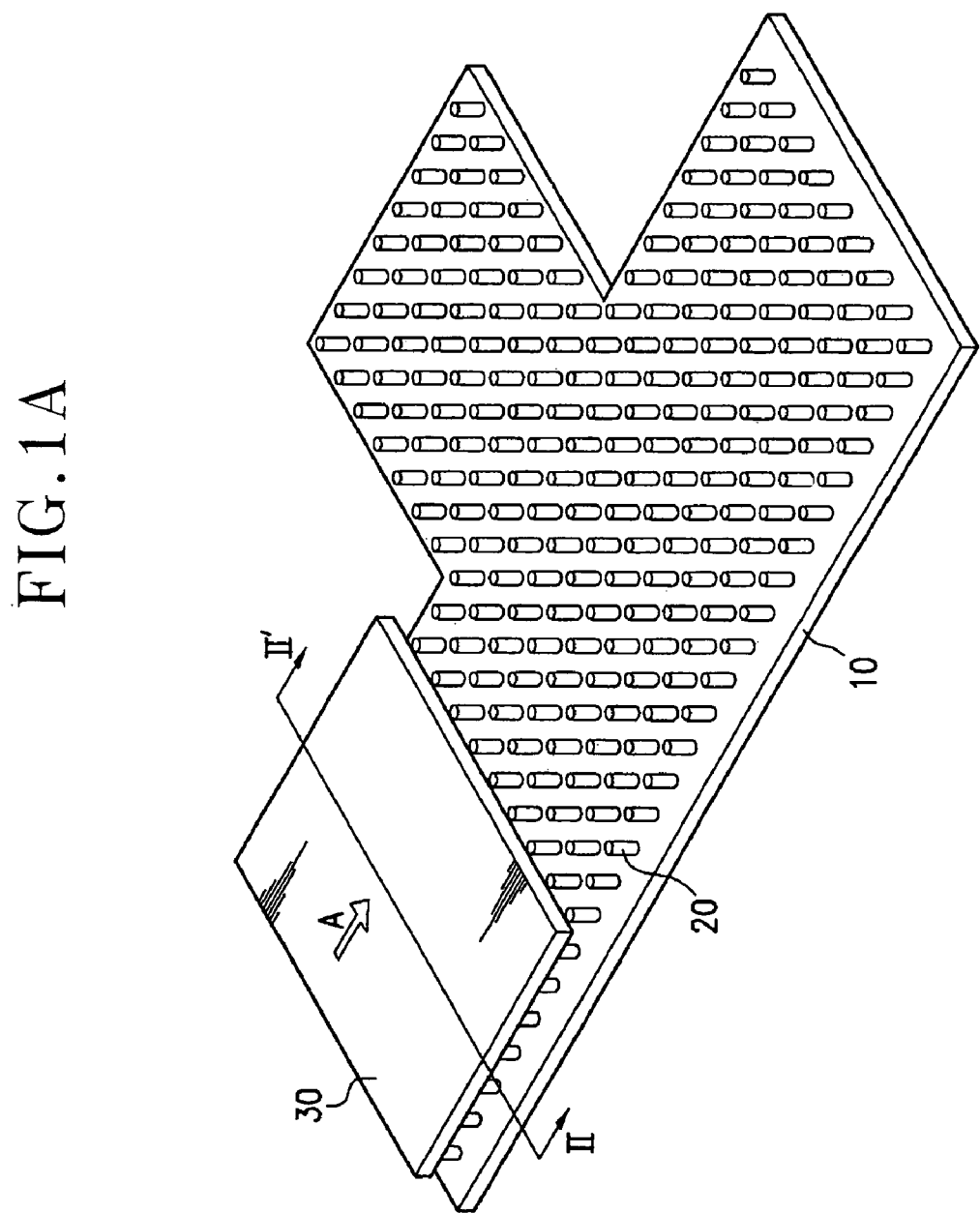
FIG. 1A is a perspective view of a transfer apparatus according to a first embodiment of the present invention showing a state in which a glass substrate is stopped.

The present invention is directed to an inline transfer system and method which minimizes transfer time by controlling and transferring glass substrates one by one for processing.

The present invention will now be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region, or substrate is referred to as being "on" another element, the element can be directly on the other element or intervening elements may also be present. In contrast, when an element is referred to as being "directly on" another element, there are no intervening elements present.

Now, an inline transfer system according to an embodiment of the present invention will be described in detail with reference to the accompanying drawings.

FIG. 1 is a schematic diagram of an inline transfer system according to an embodiment of the present invention, FIG. 2 is a layout view of an inline transfer system according to an embodiment of the present invention, and FIG. 3 shows a detailed structure of a conveyor.

Referring to FIGS. 1-3, an inline transfer system according to an embodiment of the present invention includes a plurality of processing devices 100 and 200 and a plurality of rotary conveyors 300 and 400 located between the plurality of processing devices 100 and 200. Two or more rotary conveyors are preferred.

When it is supposed that N is a positive integer and the manufacturing process of an LCD is performed by (N+3) processes, a plurality of Nth processing devices and a plurality of (N+1)th processing devices are arranged on a first floor 1 and a plurality of (N+2)th processing devices and a plurality of (N+3)th processing devices are arranged on a second floor 2.

For example, a CVD process and a photolithography process as the first and the second processes, respectively, are performed on first floor 1, and a sputtering process and an etching process as the third and the fourth processes, respectively, are performed on second floor 2.

A first inter-floor elevator 101 that transfers a plurality of substrates 30, e.g. a glass substrate, on which a CVD and a photolithography process are performed on first floor 1, to second floor 2 one by one is installed between first floor 1 and second floor 2.

A second inter-floor elevator that transfers a substrate 30 that is placed on second floor 2 to first floor 1 one by one is also installed between first floor 1 and second floor 2.

For purposes of description, the processing devices on second floor 2 in FIG. 1 are referred to as first processing devices 100 and second processing devices 200, respectively.

As shown in FIG. 1, a plurality of first processing devices 110, 120, 130, 140, and 150 and a plurality of second processing devices 210, 220, 230, 240, and 250 are arranged opposite to one another, respectively.

A first rotary conveyor 300 shaped similar to a rotary route is placed between a plurality of the first processing devices 110, 120, 130, 140, and 150 and a plurality of the second processing devices 210, 220, 230, 240, and 250. The first rotary conveyor 300 is connected to entrances 110a, 120a, 130a, 140a, and 150a and exits 110b, 120b, 130b, 140b, and 150b of each of the first processing devices and to entrances 210a, 220a, 230a, 240a, and 250a and exits 210b, 220b, 230b, 240b, and 250b of each of the second processing devices and moves a plurality of the substrates 30 one by one.

A first inline buffer 510 is arranged between the first rotary conveyor 300 and the entrances 110a, 120a, 130a, 140a, and 150a of each of the first processing devices, and a first transfer body elevator 610 is arranged between the first rotary conveyor 300 and the exits 110b, 120b, 130b, 140b, and 150b of each of the first processing devices. The first transfer body elevator 610 is also connected to the second rotary conveyor 400. Therefore, the substrate 30 in which the first process is completed can be transferred to the first rotary conveyor 300 or to the second rotary conveyor 400 by taking first transfer body elevator 610 depending on the conditions set during manufacturing.

A second transfer body elevator 620 and a second inline buffer 520 are arranged between the first rotary conveyor 300 and the entrances 210a, 220a, 230a, 240a, and 250a of each of the second processing devices. The second transfer body elevator 620 is also connected to the second rotary conveyor 400. Consequently, the substrate 30 being moved on the first rotary conveyor 300 can be carried into the entrances 210a, 220a, 230a, 240a, and 250a of the second processing devices after going through the second transfer body elevator 620 and the second inline buffer 520 depending on the conditions set during manufacturing. Substrate 30 being moved on the second rotary conveyor 400 can also be carried into the entrances 210a, 220a, 230a, 240a, and 250a of the second processing devices after going down via the second transfer body elevator 620 and going through the second inline buffer 520 depending on the conditions set during manufacturing.

As shown in FIGS. 1 and 2, first rotary conveyor 300 includes first and second transferring units 310 and 320, each of which is shaped as a long line opposing each other. Third and fourth transferring units 330 and 340, each of which is shaped as a short line, connect both end portions of first and second transferring units 310 and 320. Together, transferring units 310, 320, 330, and 340 form a shape similar to a rotary route.

A plurality of first direct transfer conveyors 350 are formed inside first rotary conveyor 300 to shorten the path that substrate 30 must travel during processing as substrate 30 moves on first rotary conveyor 300. In other words, a plurality of the first direct transfer conveyors 350 are formed or arranged between and parallel to the third and fourth transferring units 330 and 340 to connect the first and second transferring units 310 and 320 with each other.

A plurality of the first processing devices 110, 120, 130, 140, and 150 and a plurality of the second processing devices 210, 220, 230, 240, and 250 are arranged in a line along the first and second transferring units 310 and 320 of the first rotary conveyor 300.

Second rotary conveyor 400 is arranged apart from first rotary conveyor 300 by a specified distance. The structure of second rotary conveyor 400 is identical with that of first rotary conveyor 300. That is, second rotary conveyor 400 includes first and second transferring units 410 and 420, each of which is shaped in a long line opposite to each other, and third and fourth transferring units 430 and 440, each of which is shaped in a short line connecting both end portions of the first and second transferring units 410 and 420. Together, transferring units 410, 420, 430, and 440 form a shape similar to that of a rotary route.

A plurality of second direct transfer conveyors 450 are formed inside second rotary conveyor 400 to shorten the path that substrate 30 must travel during processing as substrate 30 is moved along second rotary conveyor 400. In other words, a plurality of second direct transfer conveyors 450 are formed or arranged between and parallel to the third and the fourth transferring units 430 and 440 to connect the first and second transferring units 410 and 420 with each other.

A plurality of rotary conveyors (not shown) may be arranged apart from second rotary conveyor 400 by a specified distance. It is preferable that the structure of each rotary conveyor is identical with that of the first rotary conveyor 300. However, it will be apparent that rotary conveyors 300 and 400 may be shaped to follow not only a rotary route but a rectangular, square, circular, oval, or other shaped path.

Referring now to FIGS. 3 and 4, the detailed structure of first rotary conveyor 300, second rotary conveyor 400, first direct transfer conveyor 350, or second direct transfer conveyor 450, along with the moving status of substrate 30, are shown. FIG. 4 is a sectional view of the conveyor shown in FIG. 3 taken along the line IV-IV'. An example of an applicable transfer apparatus is disclosed in co-pending U.S. patent application Ser. No. 10/863,099, filed on Jun. 7, 2004, which is incorporated by reference herein for all purposes.

As shown in FIGS. 3 and 4, first rotary conveyor 300, second rotary conveyor 400, first direct transfer conveyor 350, and second direct transfer conveyor 450 each includes a support panel 10 and a plurality of air nozzles 20 that are formed on the support panel 10 and transfer the transfer body by injecting or sucking air.

The support panel 10 is arranged along the transfer direction of the transfer body, e.g., a substrate 30. In other words, support panel 10 is installed along the direct transfer direction A of substrate 30 and also along the branch direction B along which substrate 30 is carried after being branched off at the branch point. A plurality of air nozzles 20 formed on support panel 10 are arranged along direct transfer direction A and branch direction B as well. When substrate 30 is carried, air nozzles 20 are placed under substrate 30.

The plurality of air nozzles 20 and substrate 30 do not contact one another but the plurality of air nozzles 20 are placed to maintain a prescribed distance from substrate 30. In order to do that, air nozzles 20 fix the position of substrate 30 by injecting air and forming a vacuum status inside air nozzles 20 to prevent substrate 30 from straying by the injection of air. In other words, at each air nozzle, there is simultaneous air injection impinging on the surface of the transfer object and a vacuum or suction effect, similar to a whirlpool's center, and thus the air injection "sticks" to the transfer object, thereby stabilizing the position of the transfer object.

An air transfer groove can be formed inside an air nozzle 20 to form a vacuum status inside each of the plurality of air nozzles 20. The air transfer groove can be formed to have various forms for creating simultaneous air injection and suction and in one example can be formed to be slanted or spiral in shape.

The plurality of air nozzles 20 injects air from a prescribed angle ($\theta$) in up and down directions with respect to direct transfer direction A. Accordingly, substrate 30 is moved along direct transfer direction A. In this case, since air nozzles 20 and substrate 30 do not contact one another, there is no power loss due to friction, which enhances the transfer speed while reducing noise. Furthermore, since there is no contact between substrate 30 and air nozzles 20 while transferring substrate 30, yield is enhanced by preventing breaks and cracks due to contact during transport and by preventing contamination from particles or chemicals.

As shown in FIGS. 1-3, first transfer body elevator 610 is arranged between exits 110b, 120b, 130b, 140b, and 150b of the first processing devices and second rotary conveyor 400, thereby coupling exits 110b, 120b, 130b, 140b, and 150b of the first processing devices to second rotary conveyor 400. In other words, first transfer body elevator 610 moves substrate 30 on which the first process is completed in first processing device 110, 120, 130, 140, or 150 to second rotary conveyor 400.

The second transfer body elevator 620 is arranged between the entrances 210a, 220a, 230a, 240a, and 250a of the second processing devices and second rotary conveyor 400, thereby coupling entrances 210a, 220a, 230a, 240a, and 250a of the second processing devices to second rotary conveyor 400. In other words, second transfer body elevator 620 moves substrate 30 from second rotary conveyor 400 to second processing device 210, 220, 230, 240, or 250.

First inline buffer 510 is arranged between first rotary conveyor 300 and entrances 110a, 120a, 130a, 140a, and 150a of the first processing devices. First inline buffer 510 controls the number and therefore the amount of substrates 30 carried in to first processing device 110, 120, 130, 140, or 150 by performing a buffer operation when the amount of substrates 30 carried in to first processing device 110, 120, 130, 140, or 150 gets too large. In other words, buffer 510 allows substrates to be left idle for a short time before substrates are carried in to a processing device. In addition, first inline buffer 410 may inspect and remove substrates with defects.

Also, second inline buffer 520 is arranged between second transfer body elevator 620 and entrances 210a, 220a, 230a, 240a, and 250a of the second processing devices, which controls the amount of substrates 30 carried into second processing device 210, 220, 230, 240, or 250 by performing a buffer operation when the number or amount of substrate 30 carried into the second processing device 210, 220, 230, 240 or 250 gets too large.

Figure 5A:
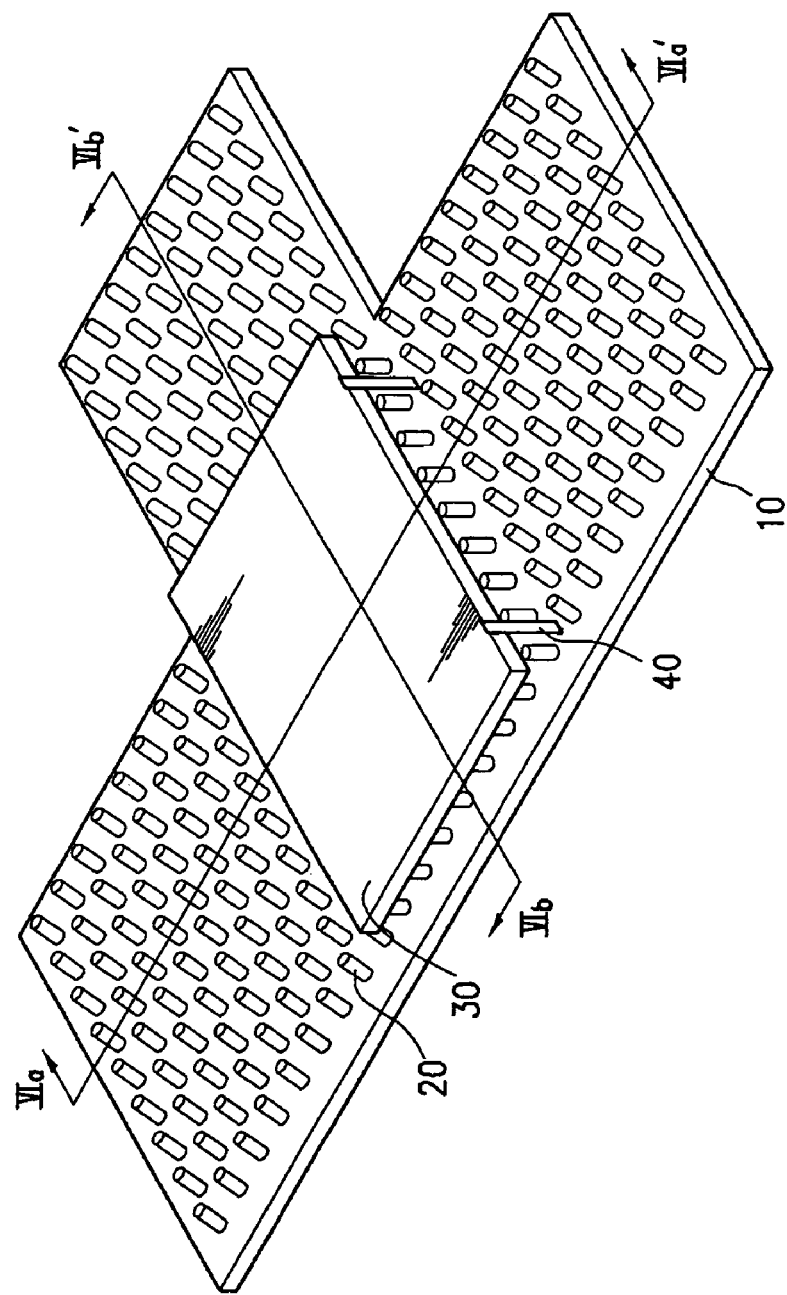
FIG. 5A is a perspective view of a transfer apparatus according to the first embodiment of the present invention showing a state in which a glass substrate is stopped at a branch point.
Figure 6A:
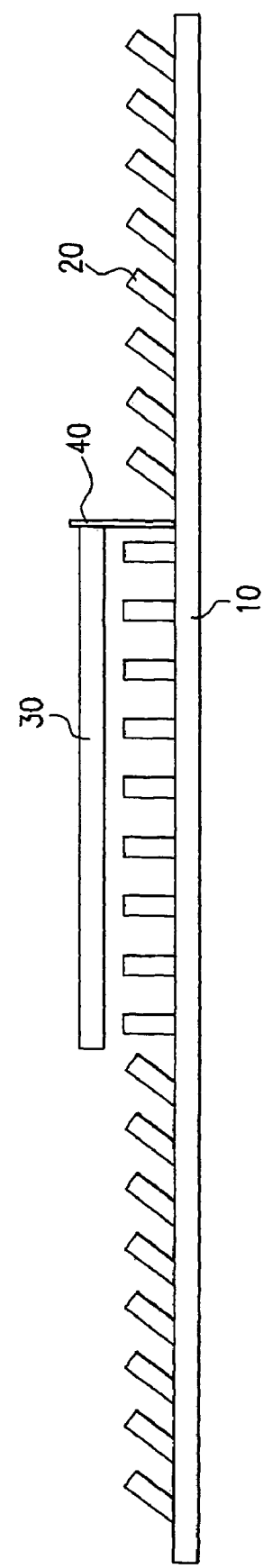
FIGS. 6AA and 6BA are sectional views of the transfer apparatus shown in FIG. 5A taken along the lines VIa-VIa' and VIb-VIb', respectively.
Figure 6B:
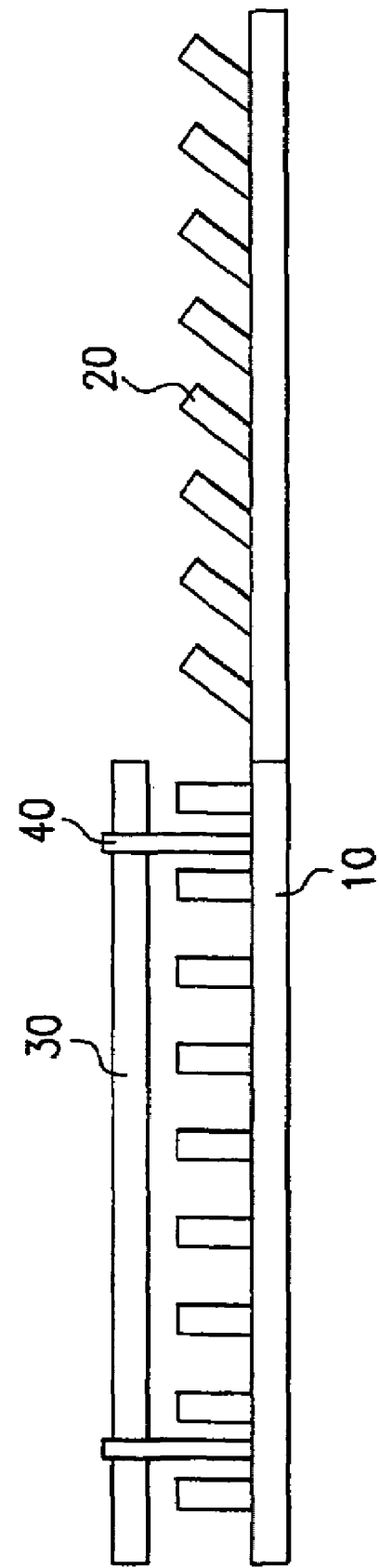

FIG. 5 is a perspective view of a part of the inline transfer system according to an embodiment of the present invention, and FIG. 6 is a flow chart describing the control process of the inline transfer system according to an embodiment of the present invention. The operation of the inline transfer system according to an embodiment of the present invention having a structure as described above will now be described with reference to FIGS. 1-6.

Substrate 30 that moves to second floor 2 riding on first inter-floor elevator 101 moves riding on first rotary conveyor 300 (S110).

While substrate 30 moves riding on first rotary conveyor 300, it is determined whether substrate 30 satisfies the condition that substrate 30 may be carried in to one of a plurality of the first processing devices 110, 120, 130, 140, and 150 (S120).

If it does not satisfy the condition that substrate 30 is to be carried in to first processing device 110, 120, 130, 140, or 150, substrate 30 keeps moving on first rotary conveyor 300 (S110).

In the case that substrate 30 satisfies the condition that it is to be carried in to one of the first processing devices, substrate 30 is carried in to one of the first processing devices 110, 120, 130, 140, and 150 (S130).

For example, five (5) of the first processing devices 110, 120, 130, 140, and 150 are drawn in FIG. 1, and the first processing devices are defined as 1-1 line 110, 1-2 line 120, 1-3 line 130, 1-4 line 140, and 1-5 line 150, respectively. As shown in FIG. 5, if the condition that substrate 30 is carried in to the 1-1 line 110 is satisfied while substrate 30 moves on first rotary conveyor 300, substrate 30 is carried in to the 1-1 line 110.

The condition that a substrate 30 is carried in is the case that another substrate 30 is not carried in to the 1-1 line 110 beforehand and the 1-1 line is ready to perform the first process with a new substrate 30. However, if another substrate 30 was carried in to the 1-1 line 110 beforehand and is in the middle of the first process, or if the 1-1 line is not ready to carry in a new substrate 30 in such cases as when the 1-1 line is under inspection, substrate 30 keeps moving as riding on the first rotary conveyor 300. While moving, if any of the 1-1 line 110, 1-2 line 120, 1-3 line 130, 1-4 line 140, or 1-5 line 150 satisfies the condition that substrate 30 is to be carried in, substrate 30 is carried in to the line and the first process is performed. Accordingly, process flexibility is ensured, which means that even though a specific manufacturing processing device line is malfunctioning, under inspection, in use, or otherwise unavailable, it does not affect the other processing device lines and production can be continued.

Then, it is determined whether the condition that substrate 30 that finishes the first process in the first processing device is to be carried in to one of the second processing devices (S140).

If any of the second processing devices satisfies the condition that substrate 30 is directly carried in, it is carried in to the second processing device while riding on first direct transfer conveyor 350 (S150).

However, if substrate 30 in which the first process is completed in one of the first processing devices 110, 120, 130, 140, or 150 does not satisfy the condition to be carried in to any of the second processing devices 210, 220, 230, 240, or 250, substrate 30 is moved on second rotary conveyor 400 after being elevated to second rotary conveyor 400 by riding on first transfer body elevator 610 (S160).

Then, while substrate 30 is moved on second rotary conveyor 400, it is determined whether the condition that a substrate is to be carried in to any of the second processing devices 210, 220, 230, 240, and 250 is satisfied (S170).

If the condition that the substrate is to be carried in to any of the second processing devices 210, 220, 230, 240, or 250 is not satisfied, the substrate 30 keeps moving while riding on the second rotary conveyor 400 (S160).

However, if the condition that the substrate is to be carried in to any of the second processing devices 210, 220, 230, 240, and 250 is satisfied, substrate 30 is carried in to one of the second processing devices 210, 220, 230, 240, and 250 riding on second transfer body elevator 620 (S180).

Then, for the substrate 30 that was carried in to the second processing device riding on first direct transfer conveyor 350 or second transfer body elevator 620, the second process is performed in the second processing device (S150 and S180190).

For example, five (5) of the second processing devices 210, 220, 230, 240, and 250 are drawn in FIG. 1 and these five first processing devices are defined as 2-1 line 210, 2-2 line 220, 2-3 line 230, 2-4 line 240, and 2-5 line 250, respectively. The substrate 30 in which the first process is completed in the first processing device 110, 120, 130, 140, or 150 is carried in to any of the 2-1 line 210, 2-2 line 220, 2-3 line 230, 2-4 line 240, and 2-5 line 250. For example, if the condition that the substrate is carried in to the 2-1 line 210, the substrate is carried in to the 2-1 line 210 riding on first direct transfer conveyor 350. As shown in FIG. 5, it is preferable that the substrate is carried in to the 2-1 line 210 riding on first direct transfer conveyor 351, which is located closest to the path between the 1-1 line 110 where the first process was completed and the 2-1 line 210, among a plurality of the first direct transfer conveyors 350.

However, if substrate 30 in which the first process is completed in the first processing device 110, 120, 130, 140, or 150 is not in the case that any of the 2-1 line 210, 2-2 line 220, 2-3 line 230, 2-4 line 240, and 2-5 line 250 satisfies the condition that the substrate is carried in, it moves riding on second rotary conveyor 400 after being transferred to second rotary conveyor 400 riding on the first transfer body elevator 610. Then, if the condition that any of the 2-1 line 210, 2-2 line 220, 2-3 line 230, 2-4 line 240, and 2-5 line 250, for example, the 2-3 line 230 satisfies the condition that the substrate is carried in, substrate 30 is carried in to the 2-3 line 230 after going down by riding on the second transfer body elevator 620.

Then, substrate 30 in which the second process is completed in second processing device 210, 220, 230, 240, or 250 moves to the next process riding on second inter-floor elevator 201 or other inter-floor elevator (S190).

On the other hand, as shown in FIG. 1, in case that substrate 30 is not carried in to any of the first processing devices 110, 120, 130, 140, and 150 or the second processing devices 210, 220, 230, 240, and 250 and moves for a long time riding on first rotary conveyor 300 and second rotary conveyor 400 because the carry-in condition is not satisfied, it is preferable that substrate 30 is temporarily stored in an off-line buffer 900. This off-line buffer 900 is arranged to be connected to a part of the first rotary conveyor 300 and a part of the second rotary conveyor 400.

Consequently, the present invention provides advantages in process flexibility. Although a specific manufacturing processing device line is malfunctioning or otherwise unavailable, it does not affect other processing device lines and production can be continued. Transfer time is also reduced due to the direct connection between the manufacturing processes.

Furthermore, the number of substrates "in process" is dramatically reduced since the substrates are managed and transferred one by one but processed in parallel. The "work in process" is a metric used in the manufacturing field since there is continual "work in process" because the same objects are continually manufactured in a factory. Since the "work in process" held in each manufacturing process are calculated in terms of monetary amount and included in the inventory, it is advantageous that the amount of the "work in process" be reduced as in the present invention. Advantageously, the present invention provides a highly efficient transfer system in which process lines are not affected even though a specific manufacturing process is malfunctioning or in use.

An inline transfer system according to another embodiment of the present invention is shown in FIG. 7. Same or similar reference numerals as in the drawings mentioned above indicate the same or similar parts for performing the same or similar function.

As shown in FIG. 7, an inline transfer system according to another embodiment of the present invention is illustrated. The inline transfer system includes a plurality of first inspection devices 71, 72, 73, and 74 and a plurality of second inspection devices 81, 82, 83, and 84 which are arranged in two lines opposite each other.

A rotary conveyor 90 shaped in a rotary route is placed between the plurality of first inspection devices 71, 72, 73, and 74 and the plurality of second inspection devices 81, 82, 83, and 84. The rotary conveyor 90 is connected to the entrances 71*a*, 72*a*, 73*a*, and 74*a* of each of the first inspection devices and to the entrances (not shown) of each of the second inspection devices and carries a plurality of the substrates 30 one by one. It will be apparent that rotary conveyor 90 may be shaped to follow not only a rotary route but a rectangular, square, circular, oval, or other shaped path.

Rotary conveyor 90 is branched off in front of the entrances 71*a*, 72*a*, 73*a*, and 74*a* of the first inspection devices in order to be connected to the entrances 71*a*, 72*a*, 73*a*, and 74*a* and is branched off in front of the entrances (not shown) of the second inspection devices in order to be connected to the entrances (not shown) of the second inspection devices.

Rotary conveyor 90 includes first and second transferring units 91 and 92, each of which is shaped in a long line opposite to each other, and third and fourth transferring units 93 and 94, each of which is shaped in a short line connecting both end portions of the first and second transferring units 91 and 92, to form a shape similar to that of a rotary route. The plurality of first inspection devices 71, 72, 73, and 74 and the plurality of second inspection devices 81, 82, 83, and 84 are arranged in one line each along the first and second transferring units 91 and 92 of rotary conveyor 90.

A plurality of direct transfer conveyors 95 are formed inside rotary conveyor 90 to shorten the path that substrate 30 must travel as substrate 30 is moved along rotary conveyor 90. In other words, a plurality of direct transfer conveyors 95 are formed between and parallel to the third and fourth transferring units 93 and 94 to couple first and second transferring units 91 and 92 with each other.

A classifying conveyor 60 is connected to the entrances (not shown) of the first inspection devices and exits 81*b*, 82*b*, 83*b*, and 84*b* of the second inspection devices and is also connected to entrances of a plurality of substrate classifiers 170 for classifying the substrates 30 in which inspection is completed.

Referring to FIG. 7, an operation of the inline transfer system according to the present invention will now be described in detail.

The substrate 30, during a manufacturing process such as an LCD manufacturing process, is moved along rotary conveyor 90 connected to the plurality of inspection devices 70 and 80 in order to enter the inspection process in inspection device 70 or 80.

While moving along rotary conveyor 90 located between the plurality of inspection devices 70 and 80, it is determined whether a condition for the substrate to be carried in to any of the first and second inspection devices 70 and 80 is satisfied. The condition that substrate 30 is carried in to one of the inspection devices 70 and 80 is the case that another substrate 30 is not carried in beforehand and, thus, the inspection process is not already in progress, or that inspection devices 70 and 80 are ready to perform the inspection process with a new substrate 30.

Substrate 30 is carried in to the inspection device that satisfies the above-referenced condition among the plurality of first inspection devices 71, 72, 73, and 74 and the plurality of second inspection devices 81, 82, 83 and 84, and the inspection is performed therein.

Meanwhile, the substrate 30 that moves riding on the first and the second transfer units 91 and 92 of the rotary conveyor 90 is carried in to the inspection device that satisfies the carry in condition riding on the rotary conveyor 90 that is extended to the entrances of the first inspection devices 71*a*, 72*a*, 73*a*, and 74*a* and the entrances of the second inspection devices.

The substrate 30 in which the inspection process is completed in one of the plurality of first and second inspection devices 70 and 80 moves to the substrate classifier 170 riding on classifying conveyor 60 that is connected to the exits of the first inspection devices and exits 81*b*, 82*b*, 83*b*, and 84*b* of the second inspection devices.

The substrate is classified after being carried in to one of the glass substrate classifiers 170 according to the inspection grade determined in the inspection process.

Presently, Transfer Apparatus embodiments applicable to the present Inline Transfer System and Method are incorporated from co-pending U.S. patent application Ser. No. 10/863,099, which was filed on Jun. 7, 2004, which is assigned to the same assignee hereof, and which previously was incorporated by reference in its entirety herein.

A transfer apparatus according to preferred embodiments of the present invention will now be described in detail with reference to the accompanying drawings.

Figure 7A:
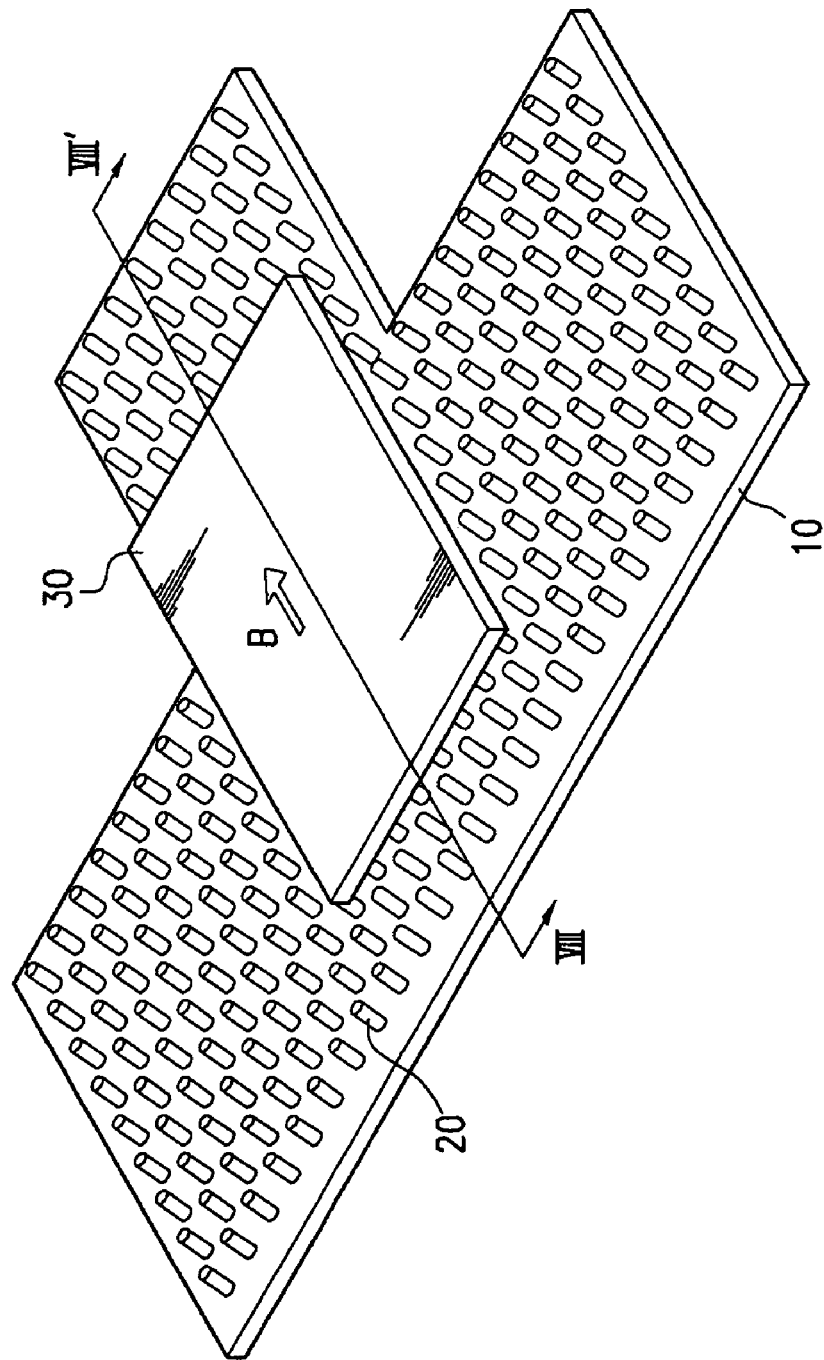
FIG. 7A is a perspective view of a transfer apparatus according to the first embodiment of the present invention showing a state in which a glass substrate is moved from a branch point to a branch direction.
Figure 8A:
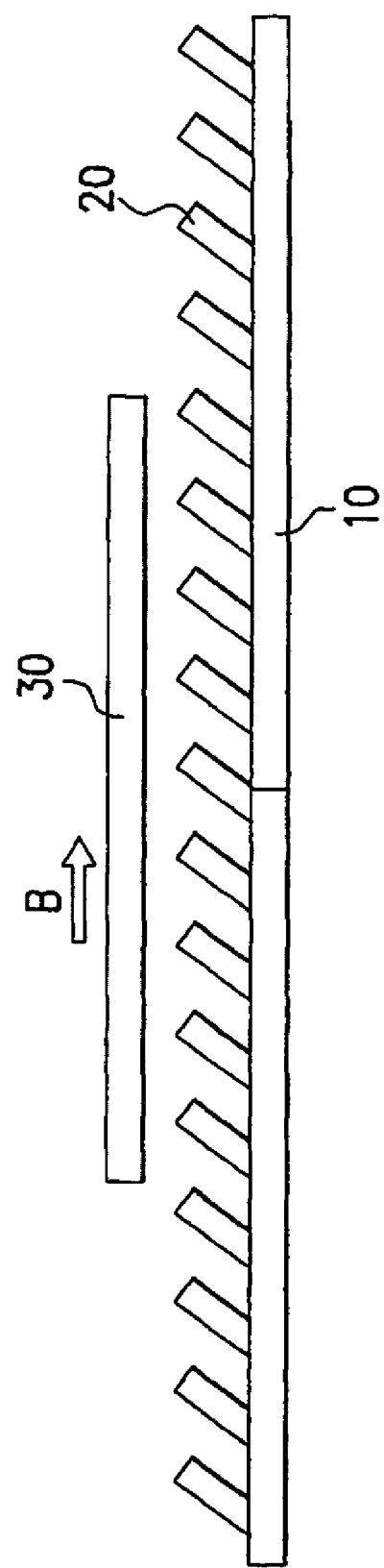
FIG. 8A is a sectional view of the transfer apparatus shown in FIG. 7A taken along the lines VIII-VIII'.
Figure 13A:
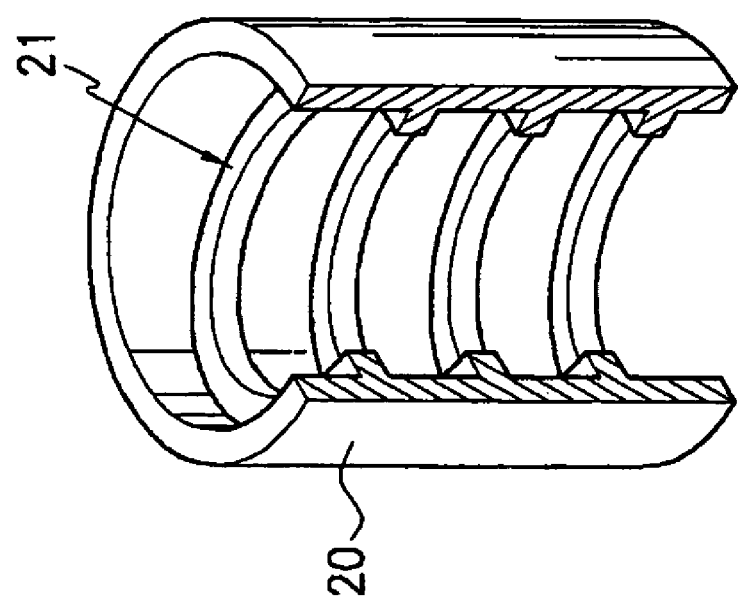
FIG. 13A is a perspective view of an embodiment of an air transfer groove formed inside an air nozzle.

FIGS. 1A-8A and 13A illustrate a transfer apparatus according to a first embodiment of the present invention. FIG. 1A is a perspective view of an example of the transfer apparatus showing a state in which a glass substrate is stopped. FIG. 2A is a sectional view of the transfer apparatus shown in FIG. 1A taken along the line II-II'. FIG. 3A is a perspective view of an example of the transfer apparatus showing a state in which the glass substrate is being transferred. FIG. 4A is a sectional view of the transfer apparatus shown in FIG. 3A taken along the line IV-IV'. FIG. 5A is a perspective view of an example of the transfer apparatus showing a state in which the glass substrate is stopped at a branch point. FIGS. 6AA and 6BA are sectional views of the transfer apparatus shown in FIG. 5A taken along the lines VIa-VIa' and VIb-VIb', respectively. FIG. 7A is a perspective view of an example of the transfer apparatus showing a state in which the glass substrate is transferred from a branch point to a branch direction. FIG. 8A is a sectional view of the transfer apparatus shown in FIG. 7A taken along the lines VIII-VIII'. FIG. 13A illustrates a perspective view of an embodiment of an air transfer groove formed inside an air nozzle.

Referring now to FIGS. 1A and 2A, a transfer apparatus includes a support panel 10 and a plurality of air nozzles 20 that are formed on the support panel 10 for transferring a transfer object 30, in one example a glass substrate. FIGS. 1A and 2A illustrate transfer object 30 at a rest position.

The support panel 10 is arranged along the transfer direction of transfer object 30. In other words, support panel 10 is installed along desired transfer directions for the transfer object, for example along a transfer direction A of transfer object 30 and also along a branch direction B (FIGS. 7A and 8A) in which transfer object 30 is carried after being branched off at a branch point of support panel 10. The plurality of air nozzles 20 formed on support panel 10 are arranged along direct transfer direction A and also along branch direction B. When transfer object 30 is carried, air nozzles 20 are placed under the transfer object 30.

As can be seen in FIG. 2A, air nozzles 20 are in a perpendicular configuration such that air nozzles 20 inject air in a perpendicular direction relative to transfer object 30 and support panel 10. The physical structure of air nozzles 20 and transfer object 30 do not come into contact with one another. Instead, air nozzles 20 are placed to maintain a prescribed distance between transfer object 30 and each of the plurality of air nozzles 20. In order to accomplish this, the plurality of air nozzles 20 fix the position of transfer object 30 by injecting air and forming a vacuum status inside each of the plurality of air nozzles 20 to prevent transfer object 30 from straying by the injection of air. In other words, at each air nozzle, there is simultaneous air injection impinging on the surface of the transfer object and a vacuum or suction effect, similar to a whirlpool's center, and thus the air injection "sticks" to the transfer object, thereby stabilizing the position of the transfer object.

FIG. 13A is a perspective view of a section of an air transfer groove 21 formed inside an air nozzle 20 to form a vacuum status inside each of the plurality of air nozzles 20. Air transfer groove 21 can be formed to have various forms for creating simultaneous air injection and suction. In one example, air transfer groove 21 can be formed to be slanted or spiral in shape.

Figure 3A:
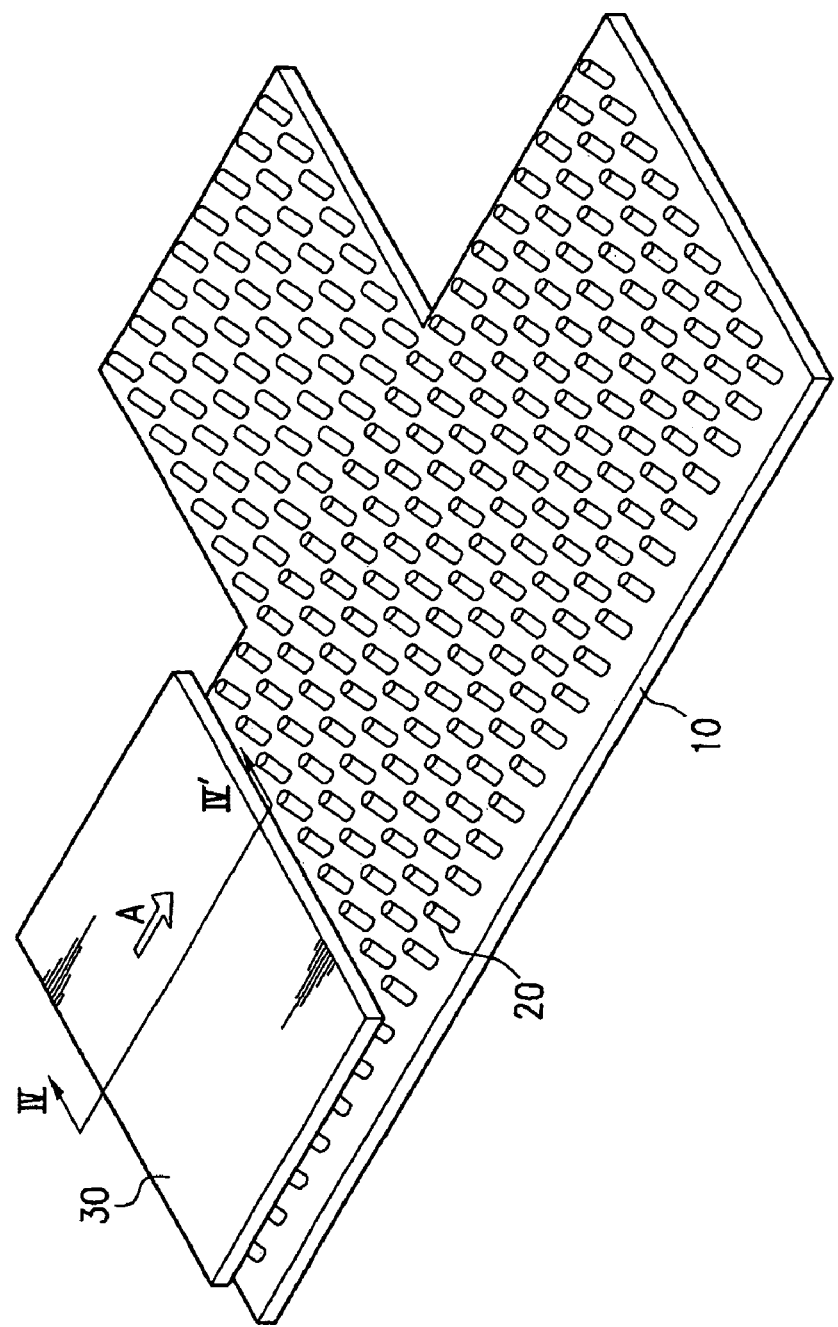
FIG. 3A is a perspective view of a transfer apparatus according to the first embodiment of the present invention showing a state in which a glass substrate is being transferred.
Figure 4A:
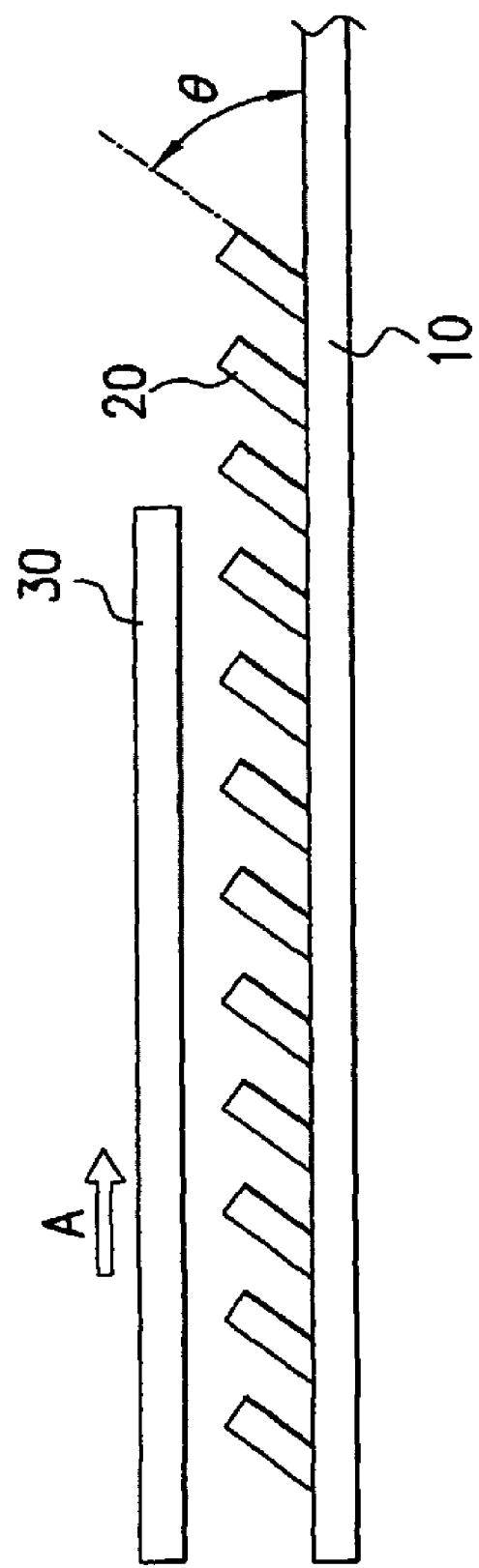
FIG. 4A is a sectional view of the transfer apparatus shown in FIG. 3A taken along the line IV-IV'.

Referring now to FIGS. 3A and 4A, an example is illustrated of transfer object 30 being moved or transferred in direction A. The plurality of air nozzles 20 are formed such that inclination of air nozzles 20 relative to the transfer direction can be controlled. FIG. 4A illustrates air nozzles 20 making a specified angle θ with reference to the transfer direction of transfer object 30, in one example direction A.

Control over the inclination of air nozzles 20 in conjunction with pressure of the air injection directs the transfer or movement of transfer object 30. If transfer direction A of transfer object 30 and the inclination of air nozzle 20 make up an angle over 0 degrees and under 90 degrees in an up and down direction, transfer object 30 would be transferred forward. If transfer direction A of transfer object 30 and the inclination of air nozzle 20 make up an angle over 90 degrees and under 180 degrees in an up and down direction, transfer object 30 would be transferred backward. Referring to FIG. 2A, if transfer direction A of transfer object 30 and the inclination of air nozzle 20 make up an angle of 90 degrees, transfer object 30 would be stopped. Transfer speed of transfer object 30 can be controlled by controlling pressure and direction of the air injected via air nozzles 20.

Advantageously, since the plurality of air nozzles 20 and transfer object 30 are not in contact with one another but maintain a prescribed distance with each other, the transfer speed is enhanced, no noise is generated, and the transfer object is transferred without damage. Distance between air nozzles 20 and transfer object 30 is preferably between about 10 μm and about 30 μm.

As noted previously, the plurality of air nozzles 20 are formed to be able to make a specified angle in up and down or back and forth directions with reference to the transfer direction of transfer object 30. Referring now to FIGS. 5A, 6AA, and 6BA, a certain set of air nozzles 20' can form a perpendicular or 90 degree angle with reference to the transfer direction of transfer object 30 when stopping and/or changing the direction of transfer object 30 at a branch point in support panel 10. Thus, some air nozzles may operate independently from one another so as to be inclined at different angles or operate with different air injection pressures in order to stop and/or change the direction of transfer object 30 during transport.

As shown in FIGS. 7A and 8A, when transfer object 30 arrives at a branch point and is stopped, the plurality of air nozzles 20' switch their inclination to branch direction B to direct transfer object 30 along the branch support panel 10 in branch direction B. Transfer object 30 can be transferred to branch direction B by switching the direction of air nozzles 20' to make an angle over 0 degrees and under 90 degrees in left and right directions with reference to the transfer direction of transfer object 30.

The operation of the transfer apparatus according to an embodiment of the present invention having a structure as described above will now be described.

First, as shown in FIGS. 1A and 2A, the plurality of air nozzles 20 engage transfer object 30 without contacting transfer object 30 with the physical structure of air nozzles 20 by injecting air. Since the plurality of air nozzles 20 are inclined 90 degrees, transfer object 30 is not moving or being transferred and is instead in a rest position.

Next, as shown in FIGS. 3A and 4A, the plurality of air nozzles 20 are inclined to have a specified angle in up and down directions with reference to direct transfer direction A of transfer object 30. The inclination of air nozzles 20 also directs the air injection from the plurality of air nozzles 20 such that transfer object 30 slides in direct transfer direction A.

Advantageously, the present invention does not require a separate driving motor or driving roller. Since the physical structures of air nozzles 20 and transfer object 30 do not come into contact with one another but instead maintain a prescribed distance from one another, there is no power loss due to friction thereby enhancing the transfer speed and no contact noise is generated.

Subsequently, as shown in FIGS. 5A, 6AA, and 6BA, when transfer object 30 arrives at the branch point, the plurality of air nozzles 20' stop transfer object 30 by being positioned such that air nozzles 20' make a 90 degree angle relative to the transfer direction of transfer object 30. Preferably, a separate stopping pin 40 is used as well to stop transfer object 30 at the branch point.

Succeedingly, as shown in FIGS. 7A and 8A, when transfer object 30 is stopped after arriving at the branch point, the plurality of air nozzles 20' are inclined toward branch direction B. The inclination of air nozzles 20' also directs the air injection from the plurality of air nozzles 20' such that transfer object 30 slides in branch direction B. Advantageously, since transfer object 30 can be branched off by simply switching the direction of a certain set of air nozzles 20', a separate feeder for branching off is not needed, and problems with slow transfer speed at branch points can be resolved.

Figure 9A:
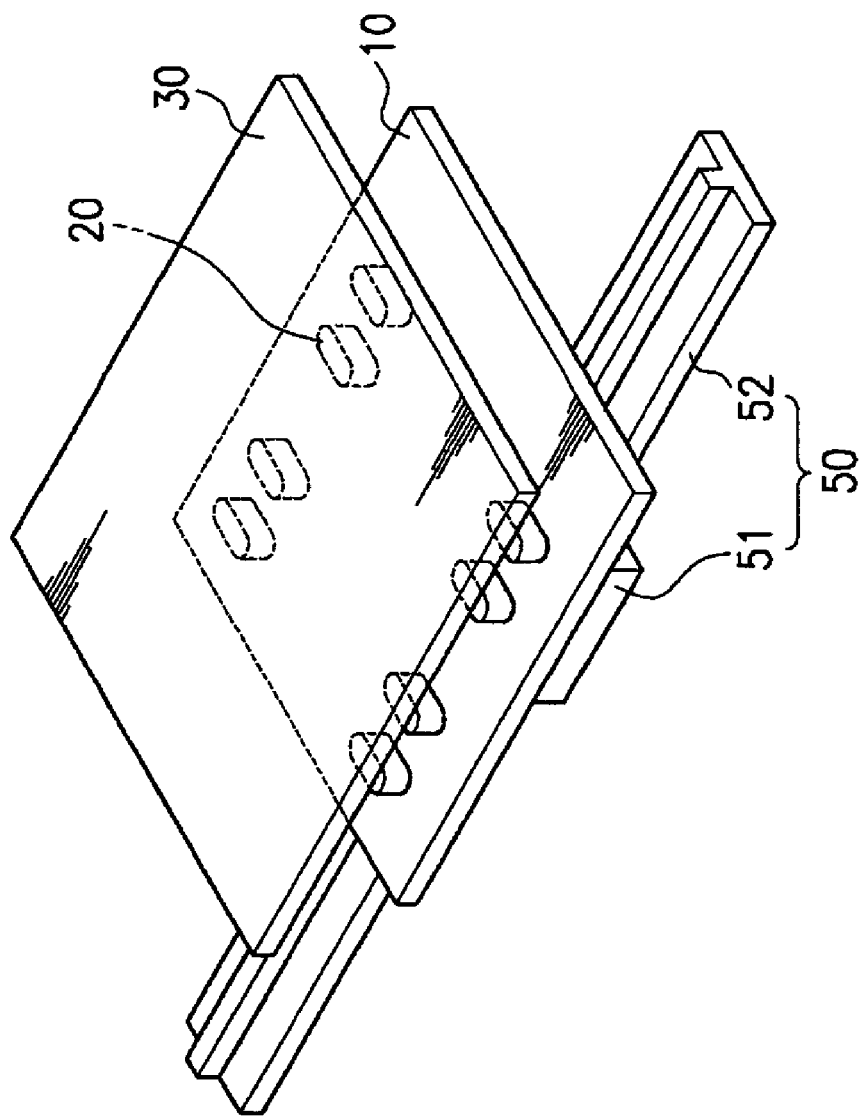
FIG. 9A is a perspective view of a transfer apparatus according to a second embodiment of the present invention.
Figure 10A:
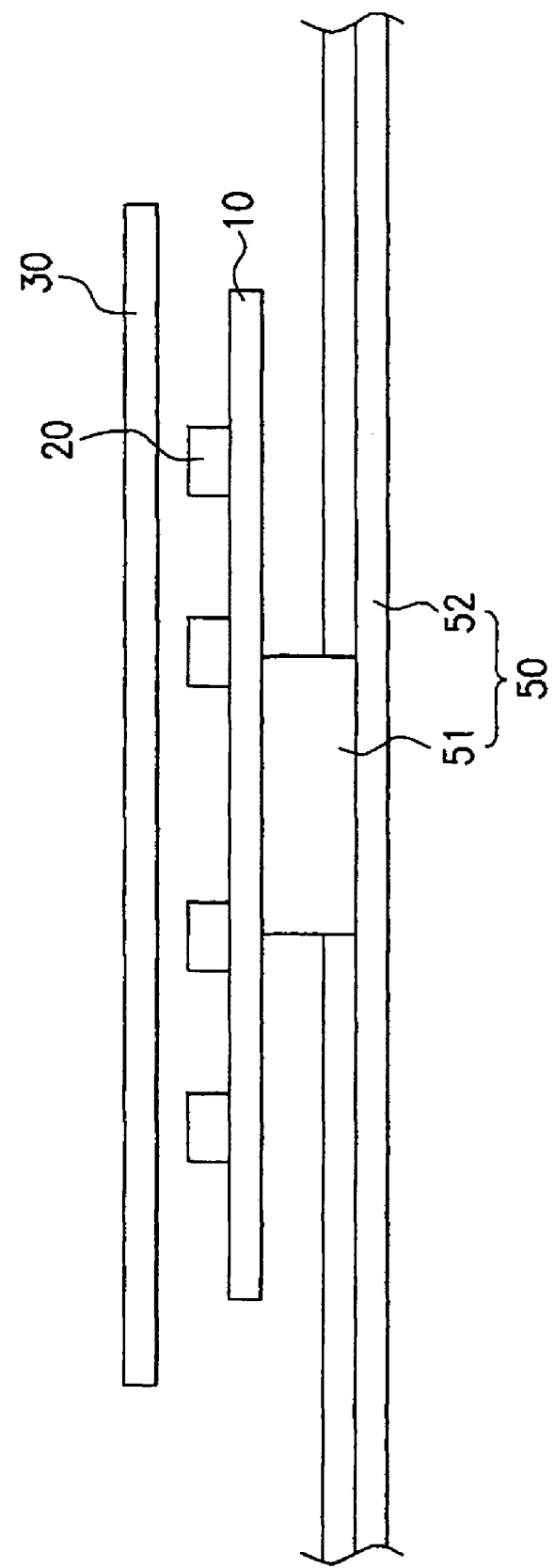
FIG. 10A is a lateral view of the transfer apparatus shown in FIG. 9A.

FIG. 9A is a perspective view of a transfer apparatus according to a second embodiment of the present invention, and FIG. 10A is a lateral view of the transfer apparatus shown in FIG. 9A. The same reference numerals in the drawings mentioned above indicate similar parts for performing similar functions.

As shown in FIGS. 9A, 10A, and 13A, a transfer apparatus according to the second embodiment of the present invention includes a support panel 10 operably coupled to a transfer means 50 for transferring a transfer object 30. Transfer means 50 includes a connection body 51 and a guide line 52 on which connection body 51 is operably coupled and moved by sliding.

A plurality of air nozzles 20 are arranged on support panel 10, and in a similar manner as described above with respect to the first embodiment, the plurality of air nozzles 20 fix the position of transfer object 30 by injecting or sucking air to form a vacuum status inside each of the plurality of air nozzles 20 while maintaining a specified distance with transfer object 30. In other words, the physical structures of air nozzles 20 and transfer object 30 do not come into contact with one another and maintain a prescribed distance from one another. In order to do that, air nozzles 20 fix the position of transfer object 30 by injecting air and forming a vacuum status inside each of the plurality of air nozzles 20 to prevent transfer object 30 from straying by the injection of air.

Referring again to FIG. 13A, an air transfer groove 21 is formed inside each air nozzle 20 to form a vacuum status inside air nozzle 20. Air transfer groove 21 can be formed into various forms such as slanted or spiral shapes.

Accordingly, as connection body 51 is moved along guide line 52, coupled support panel 10 also moves along guide line 52, thus moving transfer object 30 which is fixed to air nozzles 20 arranged on support panel 10.

The operation of the transfer apparatus according to the second embodiment of the present invention having a structure as described above will now be described.

First, transfer object 30 is fixed by a plurality of air nozzles 20 placed on support panel 10 to have a specified distance between the air nozzles and the transfer object.

Next, transfer object 30 is transferred by transfer means 50 connected to the support panel 10.

Advantageously, it is possible to transfer object 30 without contacting a pattern portion of an LCD formed on transfer object 30. Furthermore, when the transfer object has to be moved along a different direction, the transfer object may be simply transferred to the other direction by rotating transfer means 50.

It is also possible to pick up and transfer the transfer object 30 from above as is described in a third embodiment below.

Figure 11A:
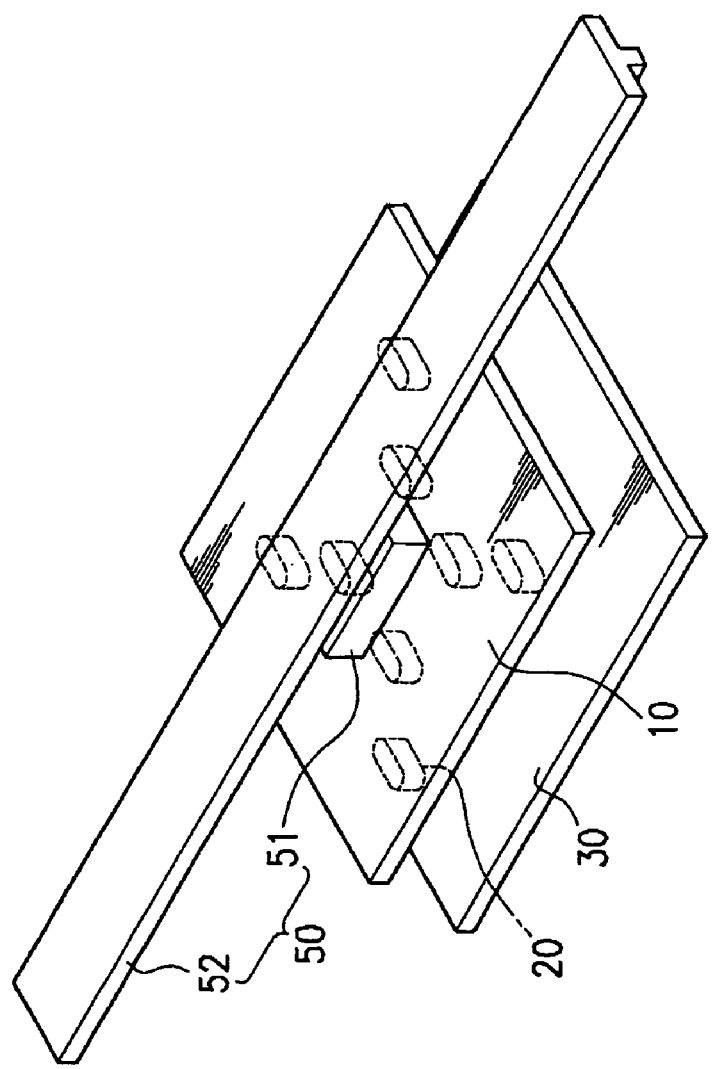
FIG. 11A is a perspective view of a transfer apparatus according to a third embodiment of the present invention.

FIG. 11A is a perspective view of a transfer apparatus according to the third embodiment of the present invention, and FIG. 12A is a lateral view of the transfer apparatus shown in FIG. 11A. The same reference numerals as in drawings mentioned above indicate similar parts for performing similar functions.

As shown in FIGS. 11A, 12A, and 13A, a transfer apparatus according to the third embodiment of the present invention includes a support panel 10 and a transfer means 50 for transferring the support panel 10. Transfer means 50 includes a connection body 51 connected to a top portion of support panel 10 and a guide line 52 on which connection body 51 is operably coupled and moved by sliding.

A plurality of air nozzles 20 are arranged under support panel 10, and the plurality of air nozzles 20 fix the position of transfer object 30 by injecting or sucking air while maintaining a specified distance with transfer object 30. In other words, the plurality of air nozzles 20 and transfer object 30 are not contacted but placed to maintain a prescribed distance with each other. In order to do that, air nozzles 20 fix the position of transfer object 30 by injecting air and forming a vacuum status inside each of the plurality of air nozzles 20 to prevent transfer object 30 from straying by the injection of air.

Referring again to FIG. 13A, an air transfer groove 21 is formed inside each air nozzle 20 to form a vacuum status inside air nozzle 20. Air transfer groove 21 can be formed to have various forms, such as slanted or spiral shapes.

Accordingly, as connection body 51 moves along guide line 52, coupled support panel 10 also moves along guide line 52, thus moving transfer object 30 which is fixed to air nozzles 20 arranged on support panel 10.

The operation of the transfer apparatus according to the third embodiment of the present invention having a structure as described above will now be described.

First, transfer object 30 is fixed by the plurality of air nozzles 20 placed under support panel 10 to have a specified distance between air nozzles 20 and transfer object 30.

Next, the transfer object 30 is transferred by transfer means 50 connected to the support panel 10.

Advantageously, it is possible to transfer object 30 without contacting a pattern portion of an LCD formed on transfer object 30. Furthermore, when the transfer object has to be rotated to be transferred to another direction, the transfer object can be simply transferred to the other direction by rotating transfer means 50.

Since the present invention transfers the transfer object, in one example a glass substrate, by only using air, the structure of the apparatus becomes simple and investment cost for the initial manufacturing processing device is reduced because a stocker, a cassette, and/or an indexer are not used.

Moreover, yield is enhanced by preventing breaking or cracks due to contact and by preventing chemical or particle contamination by providing transfer of the glass substrate without contacting the glass substrate with the air nozzles.

In addition, since the glass substrate is transferred without friction, the transfer speed is enhanced and the time required for transfer is shortened.

Furthermore, because the glass substrate is transferred only using air, the problem of transfer delay upon changing the transfer direction, for example when the glass substrate is rotated, branched off, joined together, or buffered, is resolved.

Since a gear for connection between power axes, or a chain or a belt which is a medium of power transfer is not needed, noise due to the revolution of the motor and that due to tooth-setting of the gears for connection between power axes are reduced.

Advantageously, the present invention provides great process flexibility. Although a specific inspection device may be malfunctioning, it does not affect other inspection devices and the inspection process can be continued. Furthermore, transfer time is reduced since the inspection process is performed one by one and in parallel with and the inline transfer system using the rotary conveyor 90 and classification conveyor 60.

The inline transfer system according to the present invention has advantages of dramatically reducing the amount of "work in process" by controlling and transferring the substrates one by one and by reducing the transfer time by direct connection between the manufacturing processes.

In addition, there is an advantage that the investment cost to the initial manufacturing processing device is reduced because it does not use a stocker, a cassette, or an indexer.

Moreover, the present invention provides enhanced yield by minimizing the environmental problems due to contaminating material and quality problems due to contact because of the air floating method used for conveyance.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

We claim:

1. An inline transfer system, comprising:
a plurality of rotary conveyors each including a panel, and a plurality of air nozzles operably coupled to the panel, wherein the plurality of air nozzles inject air to move a substrate above the plurality of air nozzles without the plurality of air nozzles making contact with the substrate;

at least one elevator operatively coupled between at least two of the rotary conveyors disposed on different vertical levels;

at least two processing units operably coupled to at least one rotary conveyor, wherein the at least two processing units, each of the at least two processing devices includes an entrance and an exit for the substrate;

a buffer module operably coupled to an entrance of each of the at least two processing units;

wherein the substrate exiting a first process can be transferred by a rotary conveyor either to the buffer module at the entrance of a second processing unit or to the elevator depending on conditions set during manufacturing.

2. The system of claim 1, wherein one of the at least two processing devices is capable of performing a chemical vapor deposition (CVD), photolithography, sputtering, or etch process.

3. The system of claim 1, further comprising an off-line buffer module operably coupled to the rotary conveyor.

* * * * *